United States Patent [19]

Moechnig et al.

[11] Patent Number: 4,588,092
[45] Date of Patent: May 13, 1986

[54] INTEGRATED CIRCUIT HANDLING AND CONTACT SYSTEM

[75] Inventors: Carl Moechnig; Frank C. Lunquist, both of St. Paul, Minn.

[73] Assignee: Automated Electronic Technology, Inc., N. St. Paul, Minn.

[21] Appl. No.: 551,905

[22] Filed: Nov. 15, 1983

[51] Int. Cl.⁴ .............................................. B07C 5/344
[52] U.S. Cl. .................................. 209/573; 324/158 F
[58] Field of Search ...................... 209/573; 324/158 F

[56] References Cited

U.S. PATENT DOCUMENTS

| | | | |
|---|---|---|---|
| 3,412,333 | 11/1968 | Frick et al. | 209/573 X |
| 3,701,021 | 10/1972 | Isaac et al. | 324/158 F |
| 4,195,258 | 3/1980 | Yen | 324/158 F X |
| 4,234,418 | 11/1980 | Boissicat | 209/573 X |
| 4,478,352 | 10/1984 | Amundson et al. | 209/573 X |

*Primary Examiner*—Robert B. Reeves
*Assistant Examiner*—Edward M. Wacyra
*Attorney, Agent, or Firm*—Hugh D. Jaeger

[57] ABSTRACT

Integrated Circuit ("IC") handling and contact system including adjustable stacked vertical input tracks, a single moving oscillating singulatory mechanism, a contactor assembly including configurations for leaded and leadless chip carriers and pin grid arrays, a monodirectional sorter, and adjustable output tracks. The input tracks and output tracks are adjustable for width and thickness of the IC packages. The contactor assembly includes preloaded contacts for proper penetration and wiping action for each device, pad, or pin, and provides cantileaver and torsional positioning with respect to each pin of the IC packages. The system includes an environmental chamber with the electromechanical components located in a second chamber to one side thereof and coupled by actuating shafts to the environmental chamber. The output module includes a last bin grouping for ICs which fail testing.

10 Claims, 14 Drawing Figures

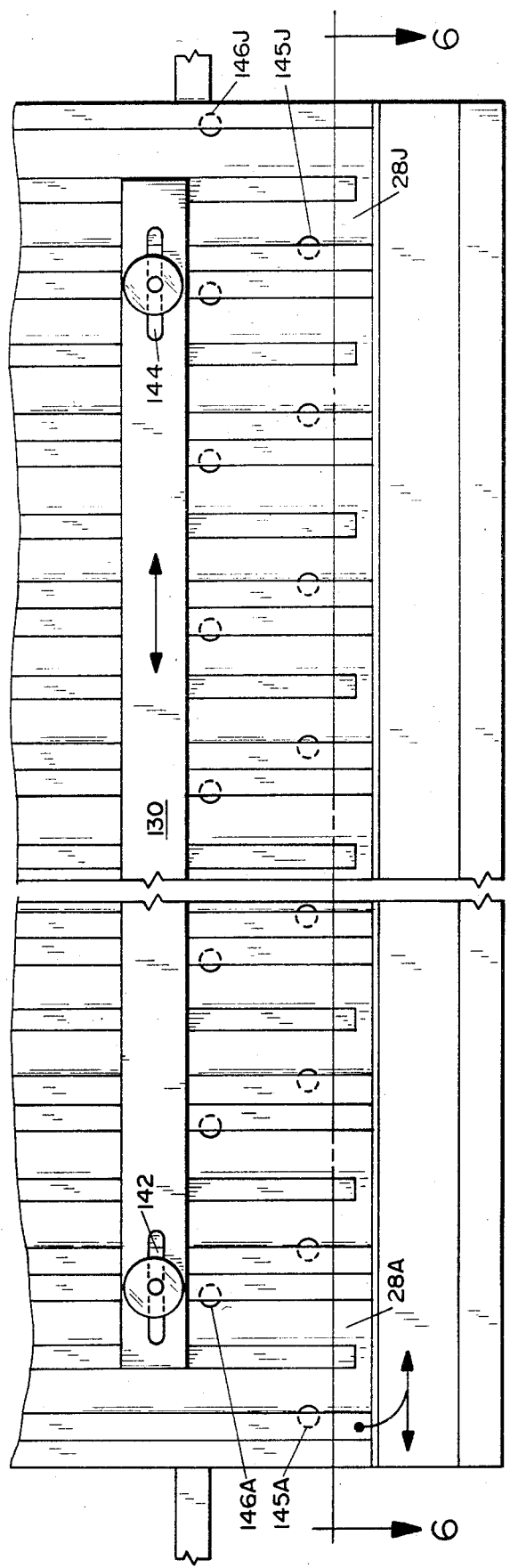
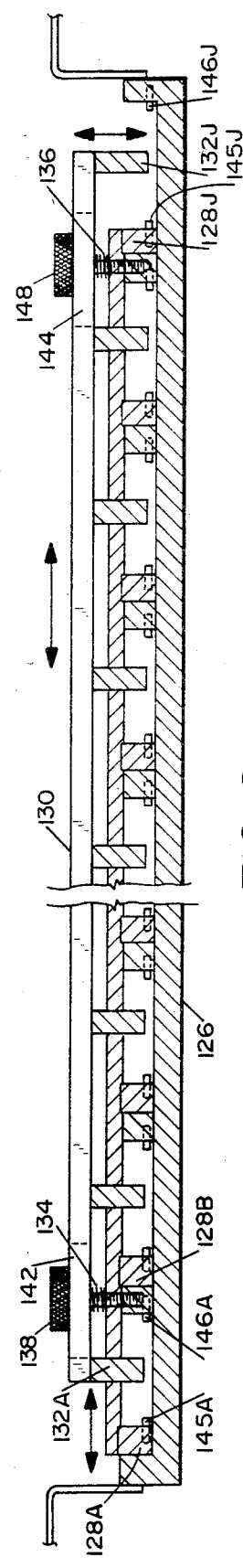
FIG. 7
FIG. 6

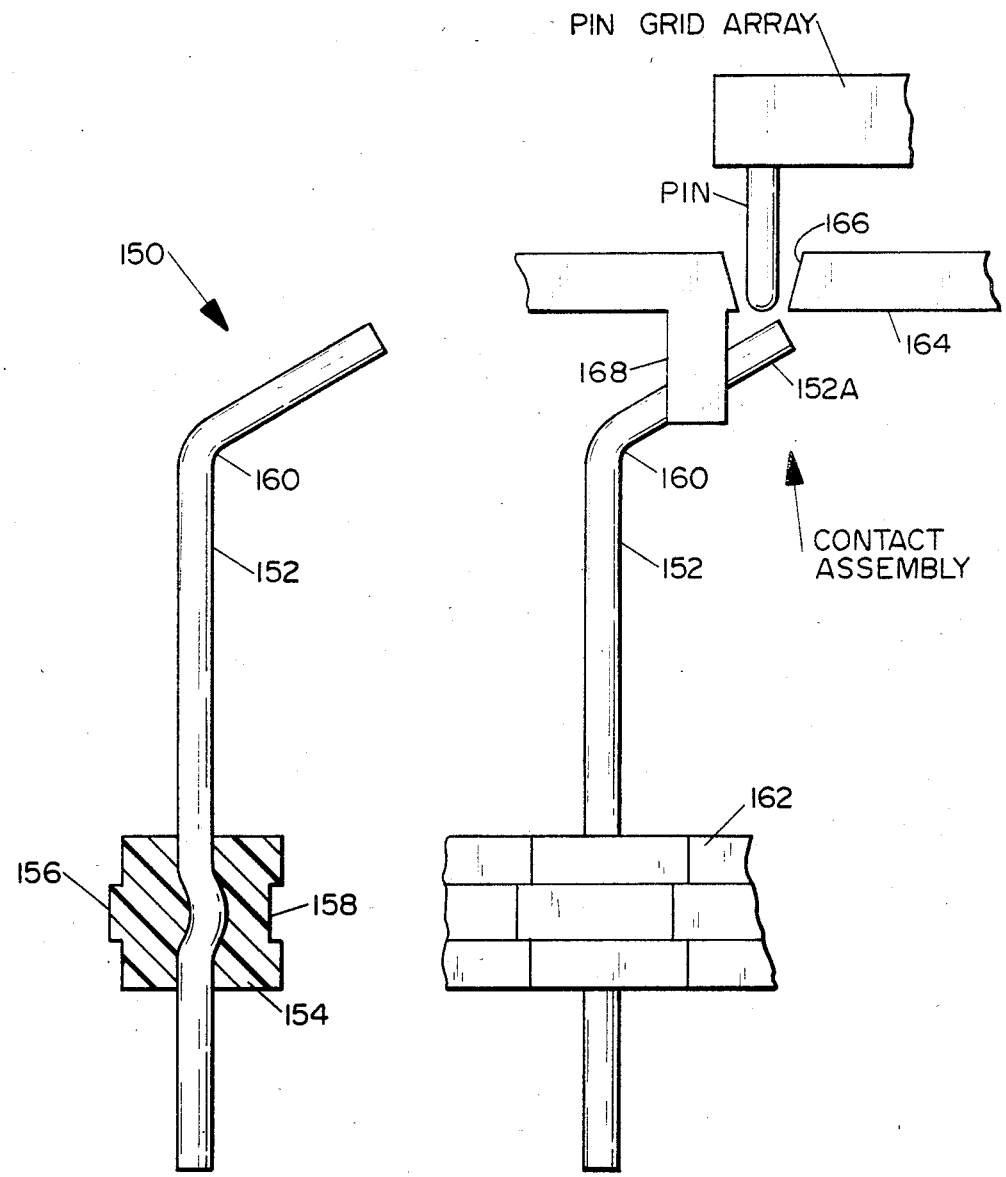

INTEGRATED CIRCUIT HANDLING AND CONTACT SYSTEM

BACKGROUND OF THE INVENTION

1. Field of the Invention

The present invention pertains to an Integrated Circuit ("IC") handling system, and more particularly pertains to an IC handling and contact system for subsequent mating to an integrated circuit tester.

2. Description of the Prior Art

The majority of the integrated circuit handlers on the market are designed to handle the most common configuration for integrated circuits, the dual-in-line package (DIP). Very few handlers are currently available to test the new integrated circuit packages. The semiconductor market has been moving away from the popular dual-in-line packages over the last few years due to technological demands. The primary advantage of the new IC packages is an electrical benefit dealing with parasitic resistance, capacitance and inductance, which enables the new IC packages to track at digital clock rates approaching four gigahertz as opposed to 500 megahertz for a DIP. Increased demand for size and weight reduction of integrated circuit packages at reasonable costs and high production yields has also led the industry to develop new and unique packages. These new integrated circuit packages are the leadless chip carrier (LLCC), the leaded chipped carrier (LCC) also called quad packs or leaded plastic, pin grid arrays, flat packs, and small outline packages. The prior art handlers were not able to test these specific packages.

The prior art integrated circuit handlers also lack adjustability to accommodate different sized packages of integrated circuits having different foot prints for making electrical contact with the multiple pads or pins such that a tester can perform subsequent tests. The prior art IC handlers lacked any substantial system for contacting pin grid arrays or quad packs.

Other prior art IC handling systems failed to remove electromechanical, mechanical, and electrical actuator components outside of the environmental chambers which caused significant breakdowns of the handling systems for the integrated circuits.

The present invention overcomes the disadvantages of the prior art by providing an IC handling and contactor system where the electromechanical, mechanical, and electrical components are located in a second chamber adjacent to an environmental chamber, a viewing window is provided through the environmental chamber, the input and output tracks are adjustable to accept variations in width and thickness of integrated circuits, contactor assemblies are provided which can on an interchange basis accommodate any configuration, such as a pin grid array, quadpack, or most other IC configurations, a singulator includes a single oscillating moving mechanism, the contactor assembly includes preloading of springs to engage the integrated circuits and the sorter is a monodirectional device.

SUMMARY OF THE INVENTION

The general purpose of the present invention is to provide an integrated circuit ("IC") handling and contact system which provides accurate temperature control in the environmental temperature soak, modular and adjustable input and output tracks for accommodating different package types and sizes within the handler configuration with only a test site interchange required, soft and gentle handling of the integrated circuits, and vertical interface plane for interconnect to a testing apparatus.

According to one embodiment of the present invention, there is provided an IC handling and contact system including an input track assembly with vertically stacked adjustable input tracks, a singulator including one pivotal moving oscillating mechanism connected to the input tracks, an interchangable contactor assembly including footprints to accommodate a desired IC package such as a quad package or pin grid array, a sorter which is monodirectional for sorting ICs into output tracks, and output tracks which are adjustable for accommodating different sizes of IC packages in a like manner as the input tracks. The contactor assembly includes preloaded contacts for making connection with the pins, pads, or leads of the IC. The vertical input tracks are positioned in an environmental chamber which is controlled electromechanically with shafts from mechanical, electromechanical, and/or pneumatic components housed in an adjacent chamber and coupled through the two chambers. The contactor assembly includes preloading of contactor probes providing for penetration and wiping where each contactor is cantilevered as well as torsional with respect to the IC pin.

One significant aspect and feature of the present invention is an integrated circuit ("IC") handling and contact system which includes a vertical interface plane. The ICs are moved by gravity from an input track through a singulator, a contactor assembly through a sorter to subsequent multiple output tracks. The system is capable of moving approximately 3,600 devices per hour in a gentle and soft handling mode although other rates are possible. Actuation mechanism allows the contacts to be closed for extended periods of time without damage to any handler components due to over heating.

Another significant aspect and feature of the system is an environmental chamber which can include a temperature range of minus 55 degrees centigrade to plus 155 degrees centigrade or greater for temperature soak prior to testing of the IC devices.

A further significant aspect and feature of the present invention is that all traveling hardware is static protective through conductive bleed off of electrostatic charges. The input and output reservoirs include a first in-first out capability with the conveyor sorting providing positive and gentle quality category binning. Controlled gravity feed also provides for soft handling. Photo optical monitoring controls the IC movement, as well with input and output status indicators.

An additional significant aspect and feature of the present invention is that the device can be interfaced to testers and test head configurations currently on the market. The system is modular in assembly construction and provides for device heating-cooling within the test site, as well as in the input soak area preceding the test site. A programable soak timer with first-in first-out track selection is also a feature.

Still additional aspects and features of the present invention is that all electronic controls are microprocessor based. The input feed track, the programable output tracks, the handler/tester logic interface, the singulation mechanisms, the contact site activation, the double test capability, temperature control, and environmental controls are all controlled accordingly from a chamber disposed next to the environmental chamber through the control panel on the housing.

Having thus described embodiments of the present invention, it is one principal object hereof to provide an integrated circuit ("IC") handling and contact system for testing leadless and leaded chip carriers and pin grid arrays, as well as other geometrical configurations of IC packages.

One object of the present invention is to provide an IC handling and contact system which provides an optimized test site, necessary to test devices at high frequency test signals.

Another object of the present invention is an IC handling and contact system which provides running hardware which is static protected to sensitive devices and operates on a gravity flow system providing for positive gentle binning and controlled gravity feed for soft handling through velocity limiting devices located throughout the running hardware.

BRIEF DESCRIPTION OF THE DRAWINGS

FIG. 6 illustrates a view along line 6—6 of FIG. 7 of output tracks;

FIG. 7 illustrates a top view of output tracks;

FIG. 8 illustrates a side view of a contact blade for testing pin grid array;

FIG. 9 illustrates a partial section of a pin grid array contact assembly for preloading the contact blades;

DESCRIPTION OF THE EMBODIMENTS

Figure 1:
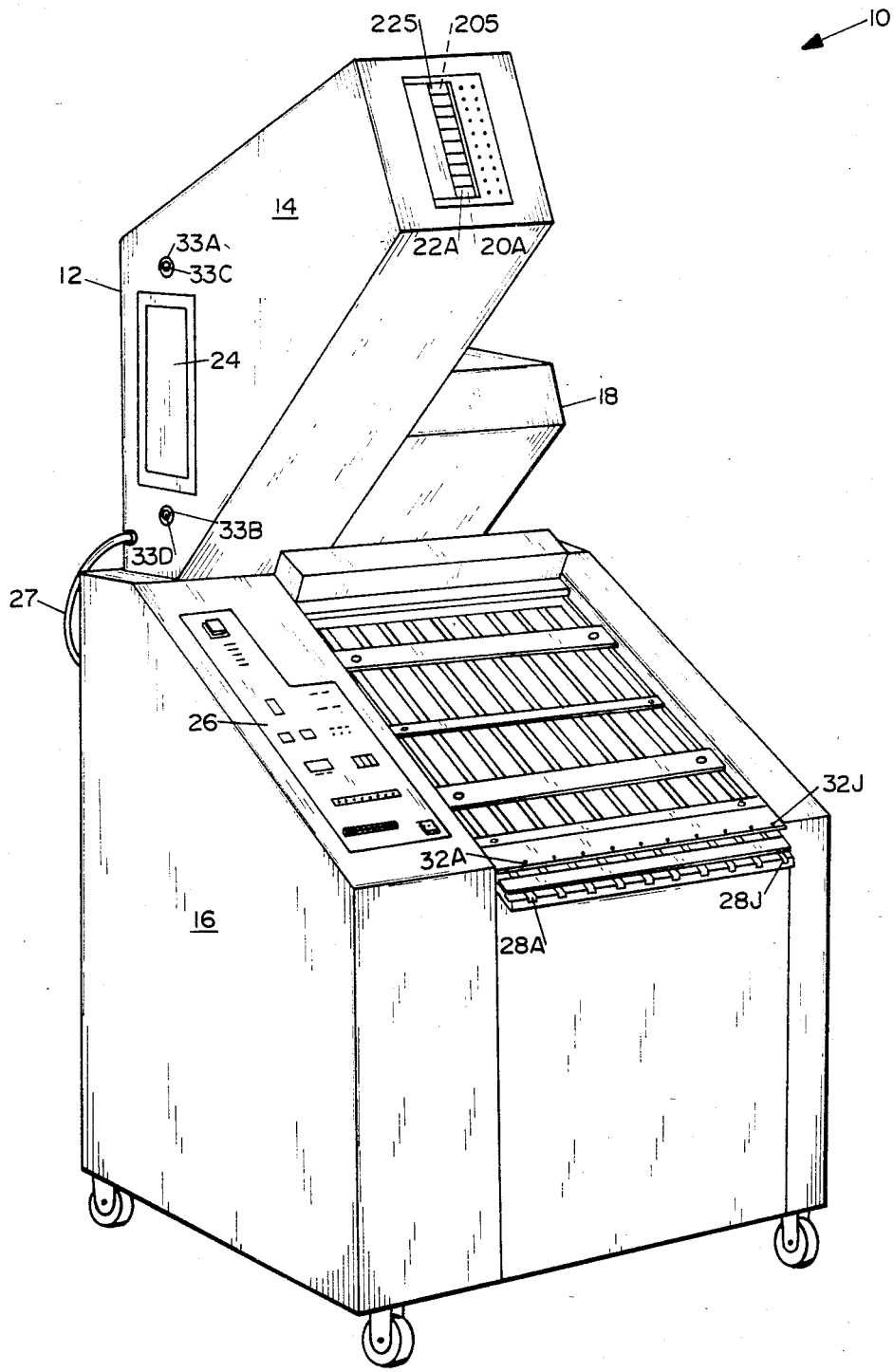
FIG. 1 illustrates a perspective view of an integrated circuit ("IC") handling and contact system.
Figure 2:
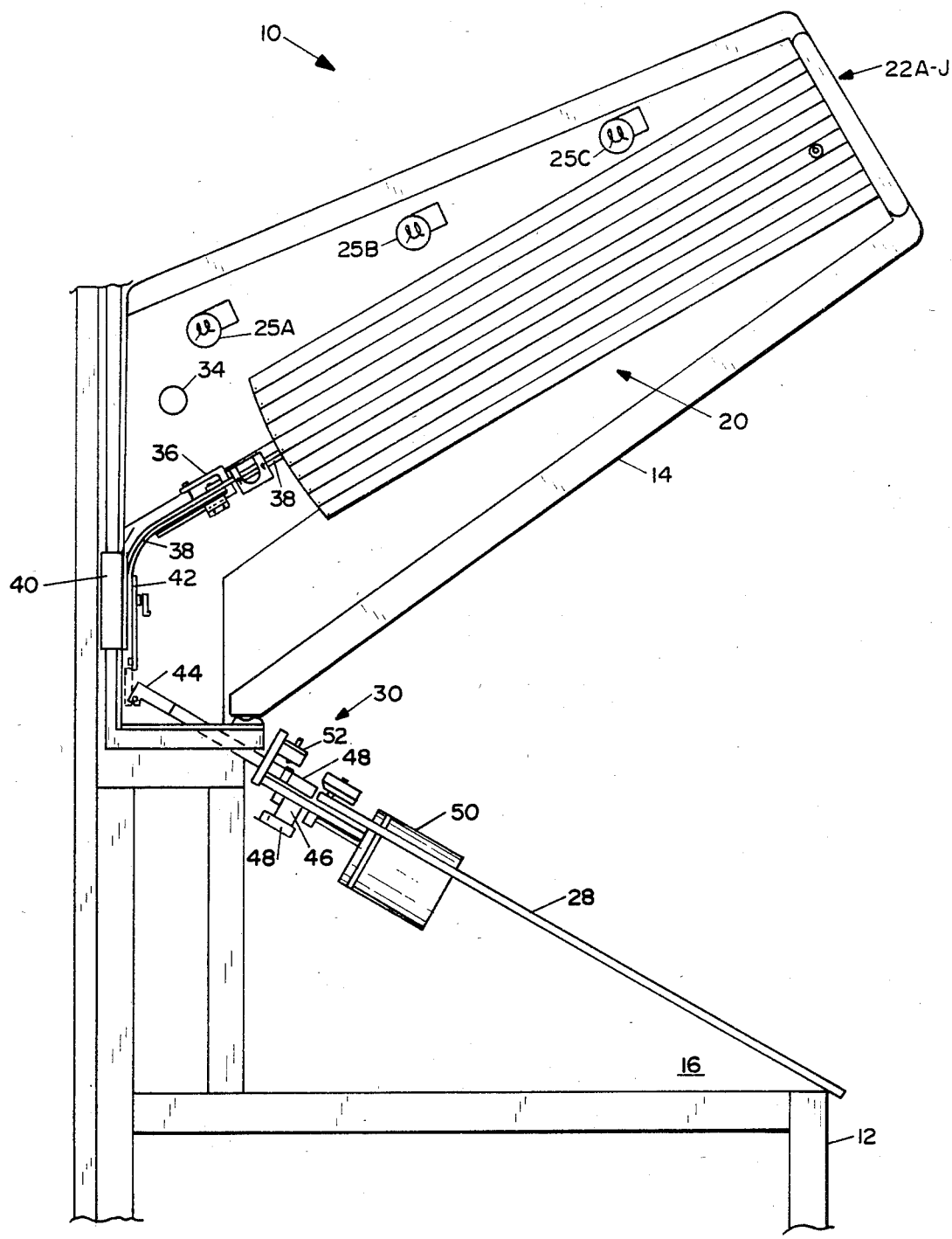
FIG. 2 illustrates a side sectional view of the system.

FIG. 1 illustrates a perspective view of an integrated circuit ("IC") handling and contact system 10 including housing 12 having an upper section 14 including an environmental chamber, a lower section 16, and an electromechanical side housing 18 for supporting electrical components, mechanical components, and electromechnical components which couple through shafts to the environmental chamber upper section 14. A plurality of input tracks 20A-20J by way of example for purposes of illustration only are positioned within section 14 having a downward gravity feed. Spring loaded doors 22A-22J provide for and secure environmental chamber. A viewing window 24 provides for viewing of the upper section environmental chamber 14, as well as the singulator mechanism as later described, the contactor assembly, and general track operation. Electric blowers-heaters 25a, 25b and 25c illustrated in dashed lines in FIG. 2 provides for a hot environmental chamber. An input line 34 provides for a liquid nitrogen system for cooling the environmental chamber. A control panel 26 provides for category quality, a hot, ambient or cold environmental chamber, retest capability for each test category, and other related handling and contacting functions. A plurality of output tracks 28A-28J extend in a downward vertical plane from a carrier belt sorting area 30 which carries the integrated circuits from below the contact assembly area in the environmental chamber 14 to the output tracks 28A-28J after test. The particular orientation of the input tracks with respect to the output tracks provides for gravity feed flow of each integrated circuit package through a singulator oscillating moving mechanism, to the contact assembly, and to a subsequent monodirectional sorter. The sorter carries each of the integrated circuit packages via carriers affixed to a carrier belt at area 30 for subsequent sorting in one of the respective tracks 28A-28J. Indicating lights 32A-32J indicate when a track is full or empty and if preprogrammed soak time has been achieved. Access ports 33A and 33B including plugs 33C and 33D are provided for access to the environmental chamber about the area of the viewing window.

FIG. 2 illustrates a side sectional view of the system 10 including the housing 12, the upper section 14, the lower section 16, the input tracks 20A-20J, the spring loaded doors 22, the output tracks 28, and the carrier belt area 30. An input coupling 34 is provided in the upper section 14 for the introduction of liquid nitrogen and air for cold mode. The singulator 36 is below the area of the input tracks 20 and singulates an IC down the gravity feed track 38. The track is essentially U shaped which is capable of handling multiple geometrical sizes of ICs such as pin grid array packages and quad packages, as well as other geometrical packages and including DIP packages. The contactor assembly 40 includes an opposing gripper 42 for the contactor assembly for electrically engaging each IC under test with a related IC tester connected to the contact assembly 40. A transfer receptacle 44 pivots about a radial center and transfers the IC from a vertical plane to an angular plane for subsequent sorting. A carrier belt 46 including a plurality of carriers 48 move into the plane of the paper for carrying an IC in each of the carriers affixed to the belt for subsequent sorting into each of the respective output tracks 28. A drive motor 106 drives the carrier belt while a plurality of solenoids 52 relates to each of ten output tracks 28 actuate each of the respective carriers for discharge of the IC by gravity to slide down into the appropriate category output track 28 as directed by the tester controlling the handler.

Figure 3:
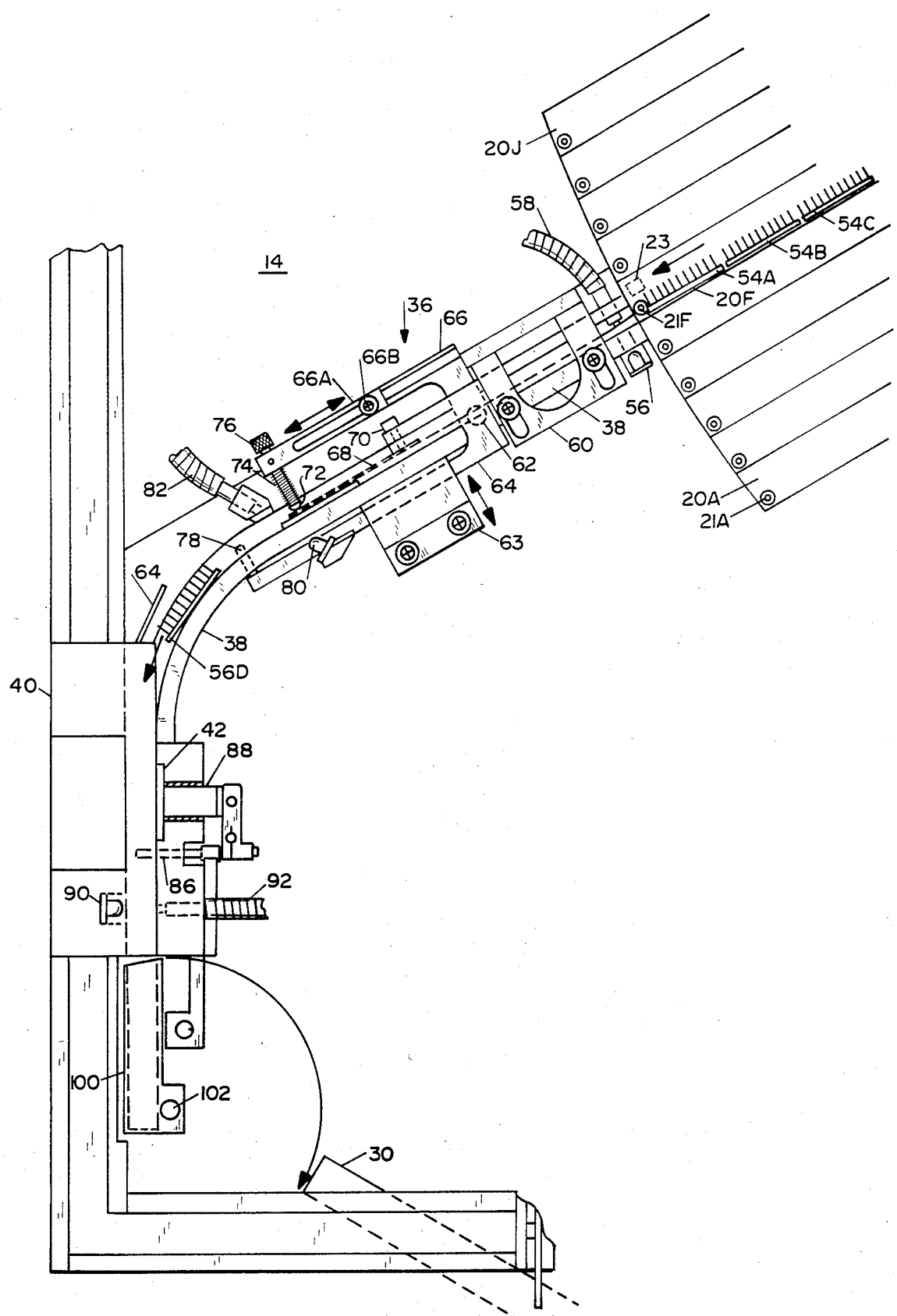
FIG. 3 illustrates a side view of an upper half of the system in section.

FIG. 3 illustrates the side view of the upper half 14 of the system 10 showing the input tracks 20A-20J, track 20F including a plurality of ICs 54A, 54B, 54C by example. A LED 56 and corresponding fiber optic 58 record the passage of an IC from the input track to the singulator. Member 60 provides internal spacing. The singulator 36 includes a pivot point 62, a U shaped yoke 64 and 66 pivoting about the pivot pin 62, a leaf blade 68 secured therein by a bolt 70. The member 66 is adjustable in length through member 66A which slides laterally into member 66 and is secured thereto by compression engagement of screw 66B. This sliding arrangement accommodates different lengths of ICs. A pressure pin 72 including a spring 74 being adjustable by screw 76 physically applies pressure to hold an IC in position pending passage of an IC 56D down the track 38. The track 38 is shown in cross section to illustrate the passage of the IC. A release pin 78 causes the release of a respective IC as programed through the microprocessor controlled by the control panel 26 as shown in FIG. 1, the microprocessor also controlling electromechanical components including an actuator which steps the singulator 36. The distance between release pin 78 and pressure pin 72 at the blade 68 is slightly greater than the length of an IC. A LED 80 operates in conjunction with a fiberoptic 82 for detecting the passage during singulation of the ICs. The release pin 78 drops away accordingly to release an IC in cooperation with the deacuation of the singulator which releases one part at a time. Adjustment for IC length is effected by means of changing the distance from release pin 78 to pressure pin 72. A shield 84 assists in guiding the ICs down the track 38 to the contact assembly 40. The contact assembly 40 includes a gripper 42 actuated for pushing an IC into and out of the contactor assembly, as later described in detail. The gripper has a track conforming to the outer edges of the IC for pushing the IC into the contactor assembly 40. The gripper is provided with a spring return for pulling the IC back out, or depending upon the type of IC, a center ejector can be provided for leaded or leadless chip carriers. A release pin or bar 86 is positioned just below the gripper 42. The release pin determines the IC vertical position stopping in the chute of the gripper for subsequent pushing the device into the contact assembly 40. An actuator 88 pushes the device in. An LED 90 and fiberoptic 92 monitors to determine when an IC has cleared the gripper after testing for subsequent testing of a second IC. Each input track includes spring based gate pin 21A-21J which is pulled out by a solenoid assembly 23 and each pin rotates by the solenoid assembly 23. The gate pins maintain the ICs in each respective track.

Figure 4:
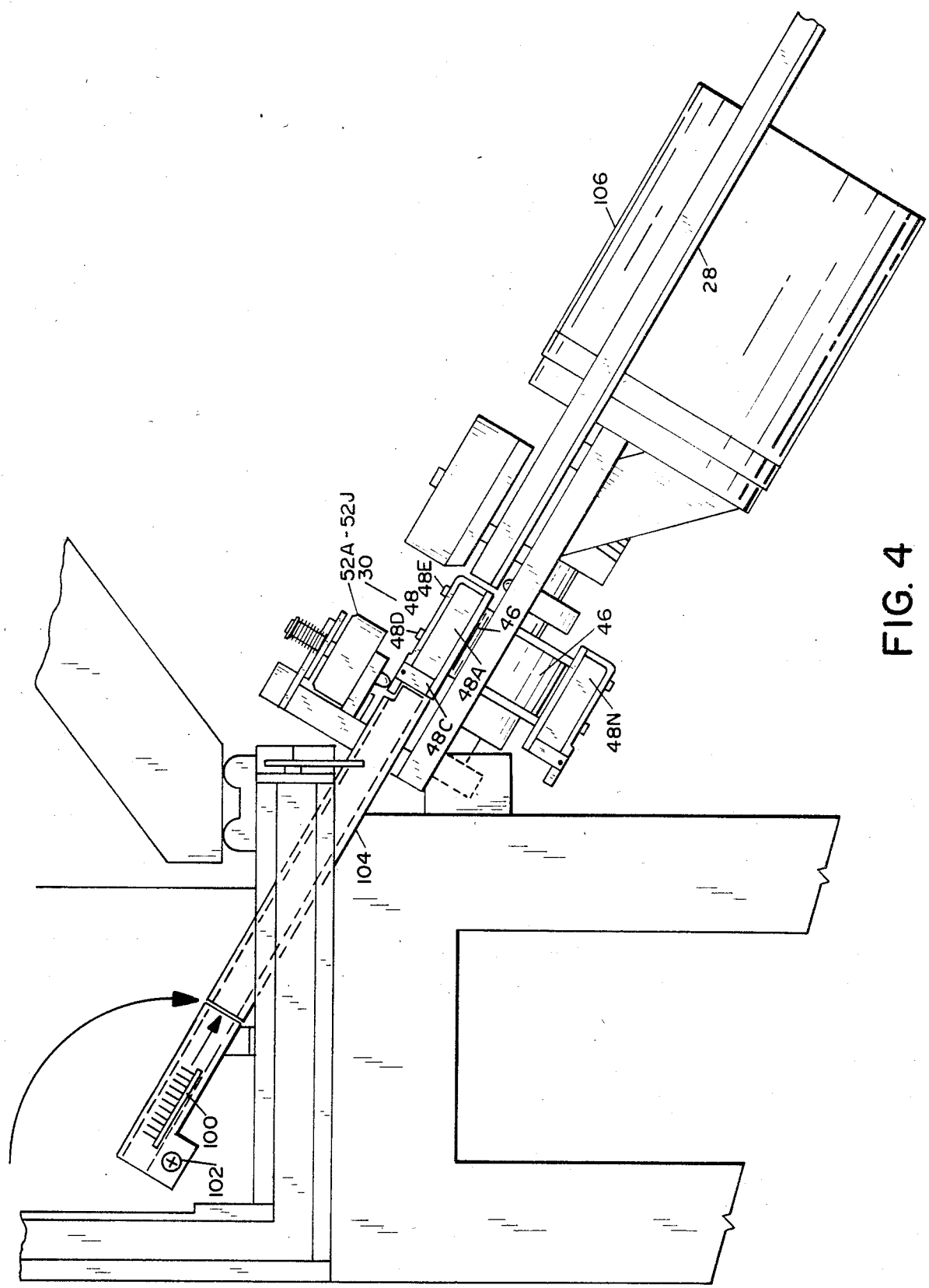
FIG. 4 illustrates a side view of a lower half of the system.

FIG. 4 illustrates a side view of the lower section 16 of the system 10. A transfer receptacle 100 pivots about a pin 102 for transferring the tested IC from the contact assembly area 40 to the carrier belt area 30 for subsequent transportation to the output tracks. The transfer receptacle 100 pivots about the radial center by a stepper motor, not illustrated, to take the IC from a substantially vertical plane to an angular plane for subsequent gravity feed into the category unique output tracks respectively. Downward gravity feed track 104 carries the ICs down to the carrier belt area 30 including the endless carrier belt 46 which carries a plurality of carriers 48A-48X. Each IC feeds into a carrier such as 48A which includes a hinged upper portion 48B pivoting around a pivot point 48C and includes screws 48D and 48E for adjusting the width of each carrier. A plurality of soleonoids 52A-52J line-up and correspond to the center of each of the output tracks. A drive motor 106 drives the carrier belt 46. The carrier belt can be appropriately described as a toothed belt with each of the IC carriers attached thereto, each of the carriers being adjustable for width of the IC.

Figure 5:
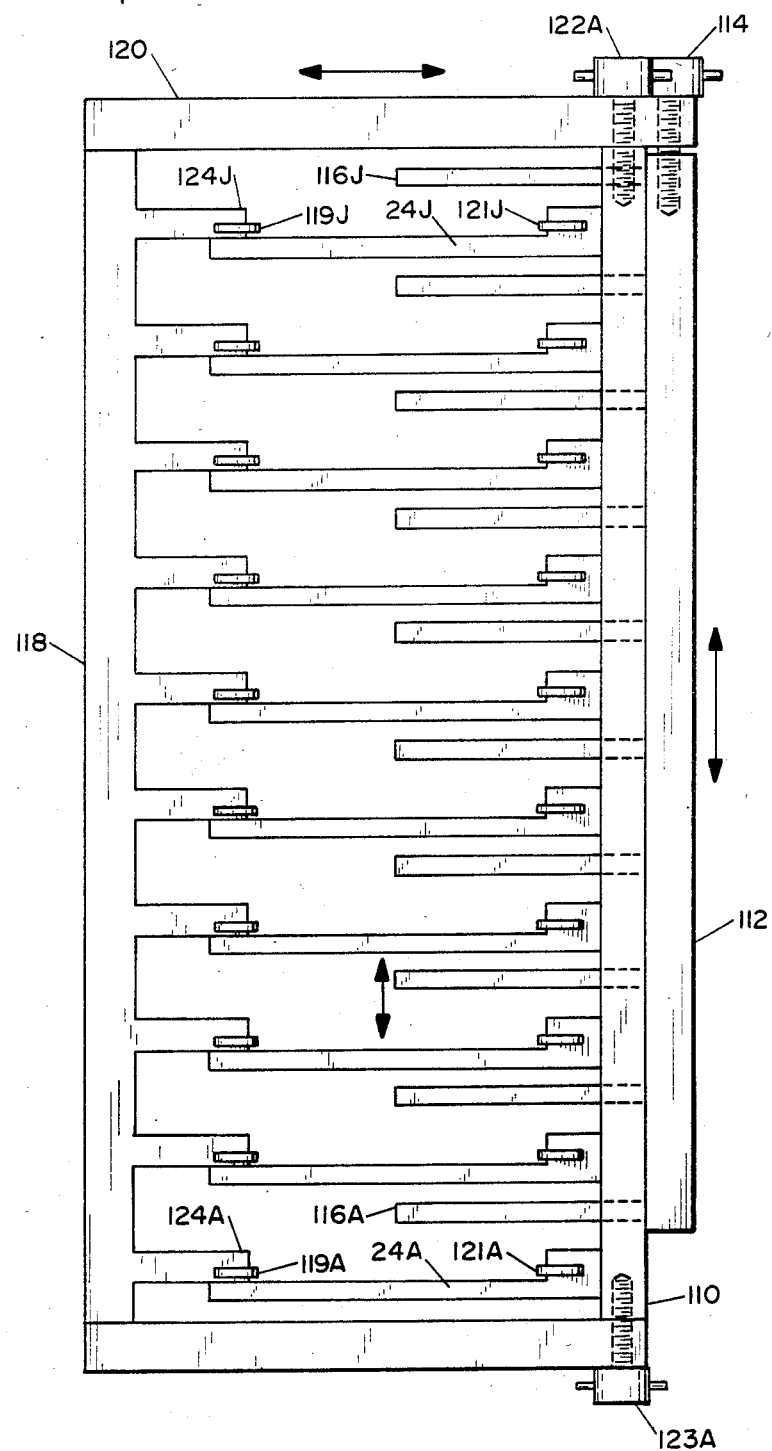
FIG. 5 illustrates an end view of input tracks.

FIG. 5 illustrates an end view of the input tracks 20A-20J illustrating the adjustability for width and height to accommodate different geometrical IC packages. Bar 110 is stationary. Bar 112 provides for up and down movement through screws 114A and 114B, for accommodating different heights of the IC. Members 116A-116J are likewise carried by bar 112. Bars 118 and 120 move left and right through opposing screws 122A-122C and 123A-123C for carrying edge member 124A-124J to provide for width adjustment for the respective IC packages. Screws 122B and 122C and 123B and 123C are behind screws 122A and 123A, respectively. Decelerating wheels 119A-119J and 121A-121J reduce IC traversing velocity for soft handling effect.

FIG. 6 illustrates a view along line 6—6 of FIG. 7 of the output tracks including fixed horizontal bed 126 with upper extending fingers 128A-128X and floating bar 130 including downwardly extending fingers 132A-132X, the bar 130 floating on springs 134 and 136 providing a moving frame assembly while the base is stationary. Screws 138 and 140 provide for adjustability through slots 142 and 144 in the bar 130. The floating bar 130 provides for adjusting the heigth as well as for sliding through the slots 142 and 144 for adjusting to the width of the IC packages. Declaratory wheels 145A-145J and 146A-146J as shown are provided for the purpose of controlling IC velocity down the output track.

FIG. 7 illustrates a top view of the output tracks where all numerals correspond to those elements previously described. The adjustability of the width of the tracks is readily seen in slotted track 130.

FIG. 8 illustrates a side view of a contact 150 for a pin grid array contact assembly. The contact 150 includes a contact blade probe or wire 152 surrounded by a dielectric block 154 which is substantially rectangular and includes a mating key 156 and a keyway 158. The key and keyways provide that a plurality of blocks can be assembled together similar in concept to building blocks for assembling a plurality of contact blades together for accommodating any geometrical pin configuration of pin grid arrays. A dimple or curved bend 58 is provided in the contact blade for securing in the block assembly 154. A single bend 160 is provided in the upper portion of the contact blade 152 in range of 0 to 180 degrees and preferably 30 degrees. The contact blade is set into the block at an angle resulting in a compound angle at the contact blade distal end relative to the pin grid pattern. This particular contact blade provides a penetration and wiping action while also provides for pressure being applied immediately between the contact blade and the pins of the pin grid array. The key and keyway of the blocks 154 provide that the blocks can be stacked together for accommodating rows of pins which are subsequently loaded into the contact assembly body.

FIG. 9 illustrates a partial section of a pin grid array contact assembly including a cover 164 which shifts at assembly for spring preloading of the contact blades. The figure illustrates a contact blade 152 which is in a contact assembly 162 and includes a top cover 164 secured thereover. The top cover includes a plurality of appropriately located holes 166A-166N for protrusion of a pin of a pin grid array and includes a downwardly extending rectangular preloading member 168. The cover 164 is provided with a plurality of holes 166 and a plurality of preloading protrusions 168A-168N for accommodating a plurality of pins on a pin grid array. When the cover 164 is affixed to the rectangular assembly of the contact assembly, cover 164 is slightly shifted and locked into place for preloading of blades 152 which places the pin grid array pins crossing through the hole 166 as seen looking down in a top view. This provides the penetration and wiping or rubbing action across each pin of the pin grid array and allows that the contact blade tip 152A provides the proper cantilevered and torsional action. This penetration and wiping or rubbing action provides for immediate and maximized pressure between the pin of the pin grid array and the contact blade for electrical contact during the electrical test.

Figure 10:
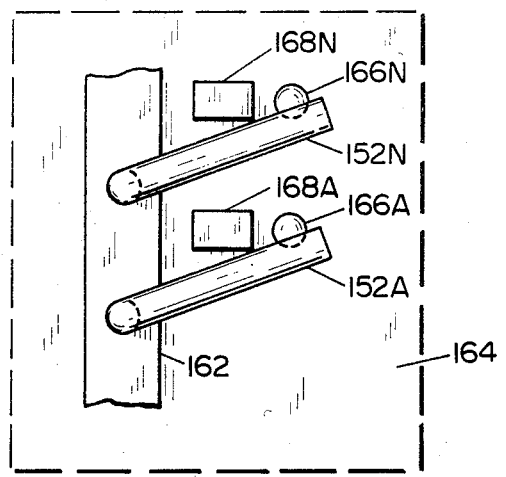
FIG. 10 illustrates a partial bottom view of FIG. 9 illustrating the compound bend.

FIG. 10 illustrates a partial bottom view of FIG. 9 where all numerals correspond to those elements previously described. The view illustrates preloading of the contact blades for pin action and engagement.

Figure 11:
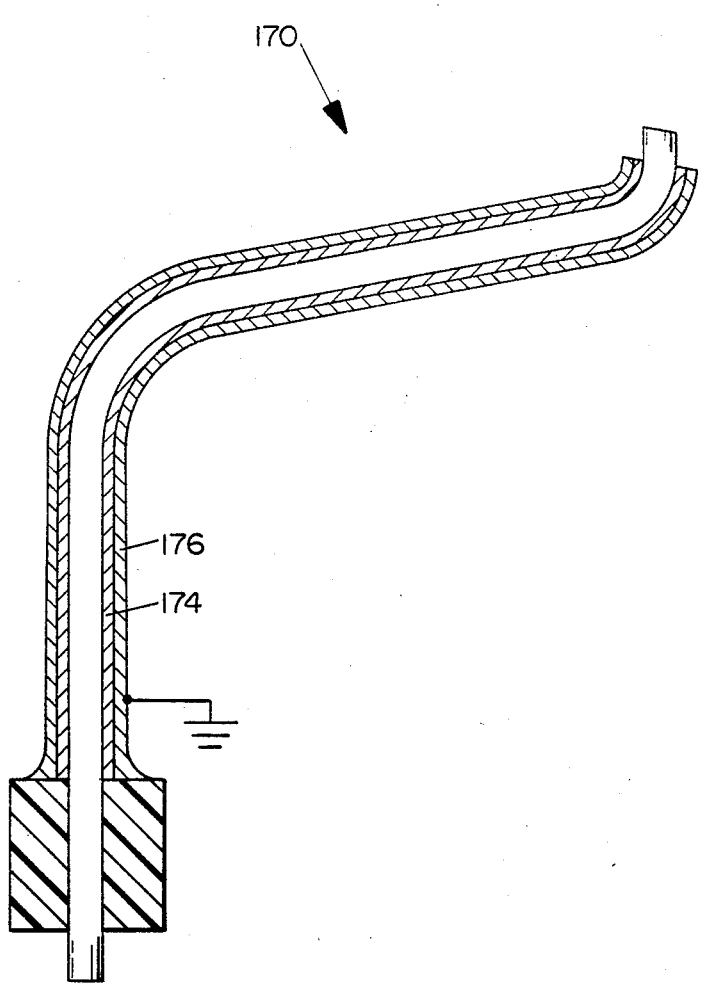
FIG. 11 illustrates a cross sectional view of a shielded contact blade.

FIG. 11 illustrates the cross sectional view of a shielded contact blade 170. The blade 172 includes a conformable flexible dielectric coating of insulation 174 and a conductive plating 176 which provides an outer conductive path. The insulation coating 174 can be a dipped coating, a sprayed coating, or the like. This type of coaxial shielded contact blade is particularly useful in high frequency signal testing.

Figure 12:
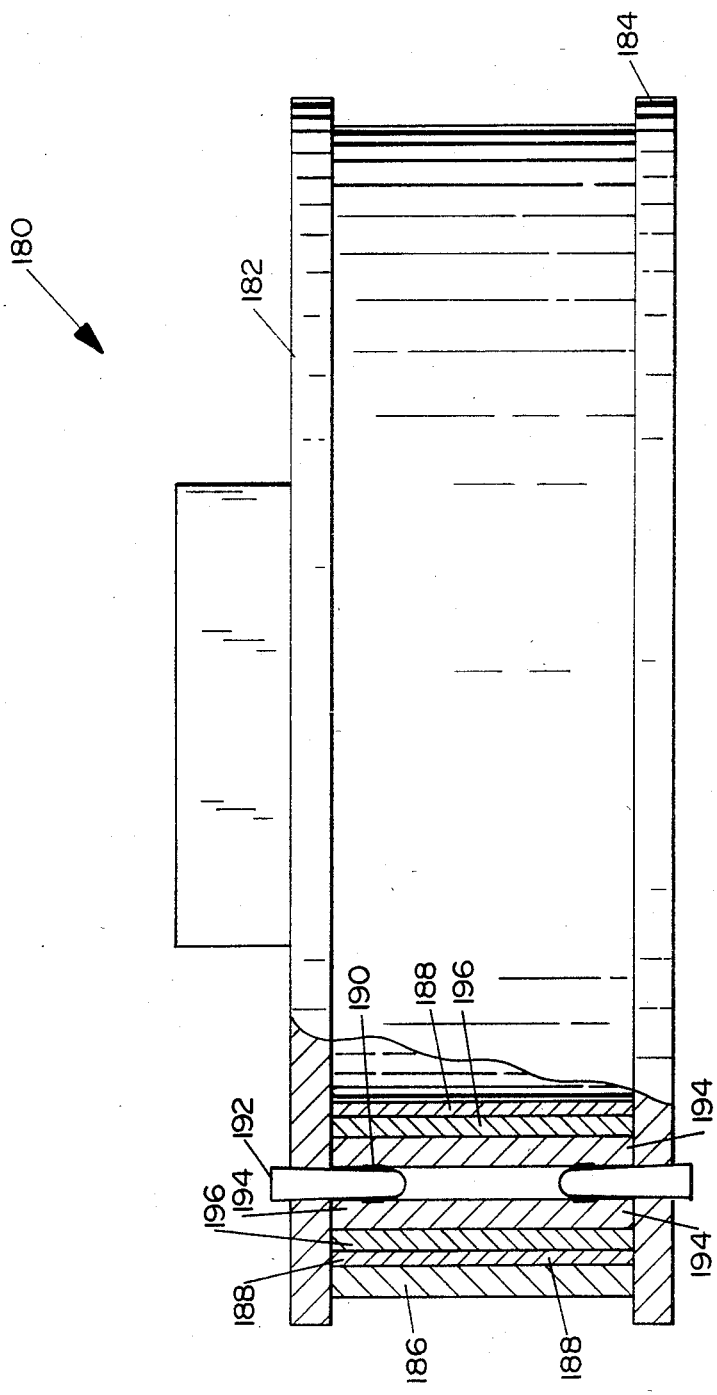
FIG. 12 illustrates a cross sectional view of a controlled impedance interface connector.

FIG. 12 illustrates a cross sectional view of a controlled impedance interface connector for a contact assembly including two printed circuit boards 182 and 184 of a pre determined impedance, a grounding ring 186, a dielectric shield 196, and a plurality of signal lines. Each of the signal lines includes a leaf connector 190, a signal pin 192, a center conductive sleeve 194, a dielectric 196, an an outer conductive sleeve 188.

Figure 13:
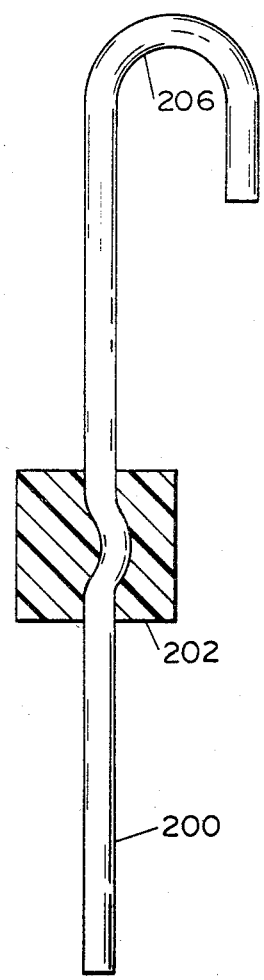
FIG. 13 illustrates a side view of a contact blade for testing leadless or leaded chip carriers.

FIG. 13 illustrates a side view of a contact blade for testing leadless or leaded chip carriers. A plurality of such properly spaced contact blades 200 mounted into a dielectric block 202. The shape of block 202 is illustrated by way of example and is not to be construed as limiting the present invention as any other different type of geometrical configuration can be utilized.

Figure 14:
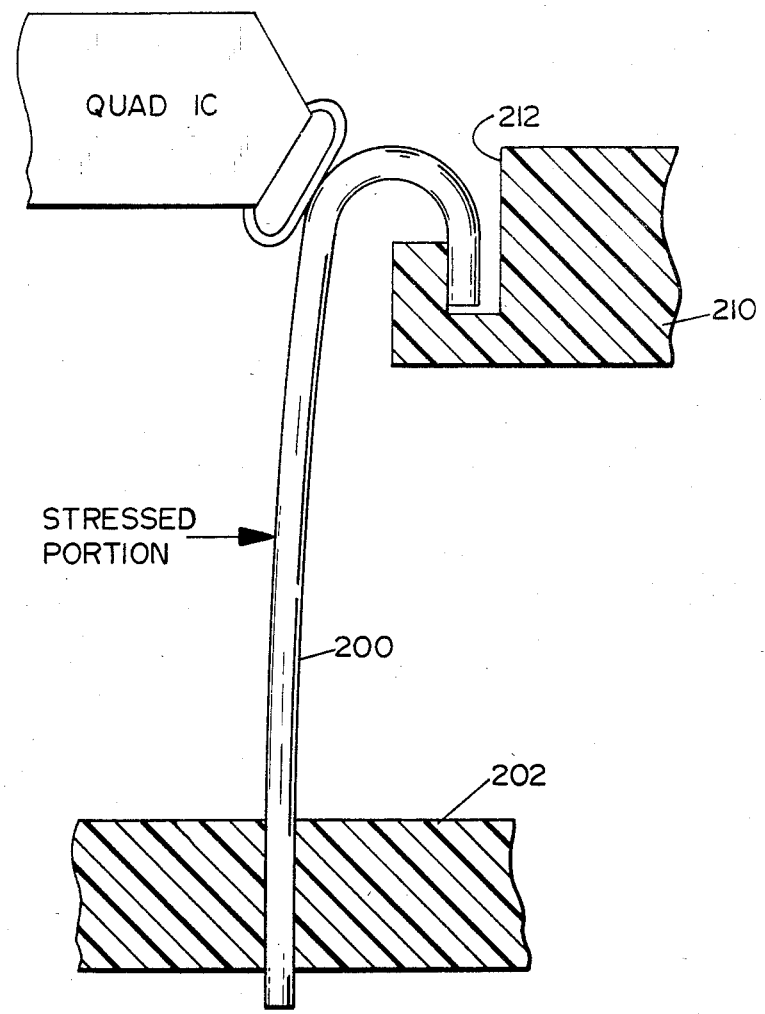
FIG. 14 illustrate a partial side view of FIG. 13 during a testing operation.

FIG. 14 illustrates a partial side view of FIG. 3 during a testing operation. The relationship of the blade to the lead of a quad pack is illustrated including a stressed junction during preloading in a contact assembly block 210 with channel 212 running there through. The physical spatial relationship between the block 202 and assembly block 210 provides for the stressed junction 214.

MODE OF OPERATION

The integrated circuit ("IC") handling and contact system is set up and connected to an IC tester through an appropriate electrical connection cable not illustrated in the figure. The system 10 is intended to be microprocessor based and adaptable for utilization with the IC testing machines currently available in the market. Once a determination is made as to the specific geometrical sized package of IC to be tested, the input tracks 20 and output tracks 28 are adjusted accordingly to accommodate the width and thickness of the respective packages. After the proper contactor assembly has been installed, the ICs are then loaded into the plurality of input tracks and the temperature is set for either a hot, ambient, or cold environmental chamber. If a hot environmental chamber is required, an electrical heater is energized. If a cold environmental chamber is required, than liquid nitrogen and dry air is passed into the chamber accordingly through the inlet 34. The control panel 26 controls the on/off functions of passing the ICs down through the singulator, into the contact assembly, along the sorter for subsequent sorting into the output tracks. The conveyor sorting provides for positive gentle binning and gravity feed for soft handling.

The photo optical device provides for monitoring movement through the singulator past the contact assembly and into the output. This provides for maximum processing of devices per hour, including with the contacts closed for extended periods. The input and output tracks provide a channeled reservoir with a first in-first out capability. A double test capability is provided through the microprocessor controls providing for reverification of devices being tested. The contact assembly and interface of the contact assembly provides for easy change over to accommodate different sized IC packages. The contact assembly and interface is signal protected, especially at high test frequencies which is desirable for the current state of the art integrated circuits. The tracks for carrying the ICs is gravity fed to include velocity deceleration to insure soft handling. The running tracks are resistant to physical abrasion and are static protected due to the inherent mechanical interconnections protecting sensitive ICs by leaking all transient charges to a common ground.

We claim:
1. Integrated circuit (IC) handling and contact system comprising:
 (a) a plurality of individual readily adjustable vertically stacked input tracks including means for accepting different width and thickness of an IC package, and means for pivoting said stacked vertical input tracks about a common pivot point;
 (b) singulator means including moving oscillating means for passing an integrated circuit one at a time on a track from one of said vertically stacked input tracks;
 (c) contactor assembly means including gripper means for engaging an integrated circuit into said contactor assembly from said singulator means;
 (d) transfer means for transferring an integrated circuit from said gripper means about a radial pivot;
 (e) sorter means including a monodirectional sorter belt and a plurality of carriers secured thereto for transporting and sorting an integrated circuit from said transfer means; and,
 (f) a plurality of individual readily adjustable output tracks for holding each tested integrated circuit including means for accepting different width and thickness of IC packages from said sorter means.

2. System of claim 1 wherein each of said input tracks includes independent means for adjusting for width and height of each of said IC package.

3. System of claim 1 wherein each of said output tracks includes independent means for adjusting for width and height of each of said IC package.

4. System of claim 1 wherein said singulator means comprises a pivotal U-shaped yoke operating against a leaf blade through an adjustable spring loaded pressure pin.

5. System of claim 1 wherein said contactor assembly includes means for accepting different geometrical IC package configurations through interchangibility of said contactor assembly.

6. System of claim 1 wherein said contactor assembly means includes a plurality of preloaded spring contact blades conforming to package geometry of said IC.

7. System of claim 1 wherein said contactor assembly means tests quad packs, leadless or leaded chip carriers.

8. System of claim 1 wherein said contactor assembly means tests pin grid array packages.

9. System of claim 1 wherein said contactor assembly tests DIP packages.

10. Integrated circuit (IC) handling and contact system comprising:
 (a) environmental chamber means for simulating hot, ambient or cold environments;
 (b) a plurality of individual readily adjustable vertically stacked input tracks including means for accepting different width and thickness of IC packages, and means for pivoting said vertically stacked input tracks about a common pivot point;

(c) electromechanical chamber means positioned adjacent to said environmental chamber means and said electromechanical components coupled to said stack means by shafts between said chambers;

(d) adjustable singulator means including moving oscillating means for passing an integrated circuit one at a time on a gravity fed carrier track for said adjustable vertical stacked input track;

(e) gripper means for engaging said integrated circuit into a contactor assembly from said track adjacent said singulator means;

(f) transfer means for transferring an integrated circuit from below said gripper means and about a radial pivot point;

(g) sorter means including a monodirectional sorter belt and a plurality of carriers secured thereto for transporting and selective controlled sorting an integrated circuit from said transfer means; and, (h) a plurality of individual readily adjustable output tracks for holding each tested integrated circuit including means for accepting different width and thickness of IC packages from said sorter means.

* * * * *